United States Patent [19]

Yoshida et al.

[11] Patent Number: 4,928,163
[45] Date of Patent: May 22, 1990

[54] SEMICONDUCTOR DEVICE

[75] Inventors: Toshihiko Yoshida; Toru Inaba, both of Yokohama, Japan

[73] Assignee: Fujitsu Limited, Kawasaki, Japan

[21] Appl. No.: 315,196

[22] Filed: Feb. 27, 1989

Related U.S. Application Data

[63] Continuation of Ser. No. 839,525, Mar. 14, 1986, abandoned.

[30] Foreign Application Priority Data

Mar. 20, 1985 [JP] Japan .................................. 60-57416

[51] Int. Cl.$^5$ ............................................. H01L 11/14
[52] U.S. Cl. .................................. 357/23.3; 357/23.4;
357/23.8; 357/23.9
[58] Field of Search ..................... 357/23.3, 23.4, 23.8,
357/23.9, 41

[56] References Cited

U.S. PATENT DOCUMENTS 4,172,260 10/1979 Okabe et al. ............................ 357/51
4,560,582 12/1985 Ichikawa ......................... 357/23.3 X
4,680,603 7/1987 Wei et al. ......................... 357/23.3 X

OTHER PUBLICATIONS

Balasubramanyam, K., et al., "Characterization of As-P Double Diffused Drain Structure" IEDM 84, pp. 782-785, Dec. 1984.
Hsia, S., et al., "Polysilicon Oxidation Self-Aligned MOS(POSA MOS) . . . " IEEE Elec. Dev. Lett. vol. EDL-3, No. 2, Feb. 1982, pp. 40-42.
IEEE Transactions on Electron Devices, vol. Ed-29, No. 4, Apr. 1982, pp. 590-596, New York, TSANG et al.: "Fabrication of High-Performance LDDFET'S With Oxide Sidewall-Spacer Technology".
IEEE Transactions On Electron Devices, vol. ED-30, No. 6, Jun. 1983, pp. 652-657, New York, E. Takeda et al.: "An AS-P(n+-n-) Double Diffused Drain MOSFET for VLSI's".
IEEE Transactions On Electron Devices, vol. ED-32, No. 3, Mar. 1985, pp. 562-570, New York, M. Koyanagi et al.: "Optimum Design of n+-n-Double-Diffused Drain MOSFET to Reduce Hot-Carrier Emission".
Patents Abstracts of Japan, vol. 10, No. 42 (E-382) [2099], 19th Feb., 1986 & JP-A-60 198 780 (Seiko Denshi Kogyo K.K.) 08-10-1985.
Patents Abstracts Of Japan, vol. 10, No. 91 (E-394) [2148], Apr. 9, 1986; & JP-A-60 234 367 (Hitachi Seisakusho K.K.) 21-11-1985.
Patents Abstracts Of Japan, vol. 9, No. 298 (E-361) [2021], 26 Nov. 1985; & JP-A-60 136 376 (Hitachi Seisakusho K.K.) 19-07-1985.
European Search Report, The Hague, 9-11-86.

*Primary Examiner*—Andrew J. James
*Assistant Examiner*—Sara W. Crane
*Attorney, Agent, or Firm*—Staas & Halsey

[57] ABSTRACT

A semiconductor device formed in a semiconductor substrate and having a gate electrode formed on the semiconductor substrate, source and drain regions are formed in said the semiconductor substrate. The source and drain regions are made of a first impurity region doped with impurities of an opposite conductivity type to that of a semiconductor substrate formed at portions adjacent to the edge of the gate electrode, a second impurity region doped with impurities of an opposite conductivity type to that of a semiconductor substrate formed at portions under the first impurity region, and a third impurity region doped with impurities of opposite conductivity type to that of a semiconductor substrate formed at portions spaced apart from the edge of the gate electrode. The impurities of the second impurity region have a diffusion coefficient larger than that of the impurities of the first impurity region. The third impurity region has a higher concentration than that of the first and the second impurity regions and in addition the impurities of the third impurity region have a diffusion coefficient smaller than that of the second impurity region.

17 Claims, 5 Drawing Sheets

SEMICONDUCTOR DEVICE

This is a continuation of co-pending application Ser. No. 839,525 filed on Mar. 14, 1986, now abandoned.

BACKGROUND OF THE INVENTION

1. Field of the Invention

The present invention relates to a semiconductor device. More particularly, it relates to a semiconductor device wherein source and drain regions having three regions formed by three different types of impurity doping steps are formed to prevent the occurrence of hot electrons which otherwise cause deterioration of the device performance.

2. Description of the Related Art

With the miniaturization of the semiconductor device the length of the gate electrode of a MIS FET has been shortened. The supply voltage is generally maintained at 5 V, and does not have a lowering tendency. This causes the problem that particularly in an n channel MIS transistor, the drain electric field is greater than in a conventional device, and a portion of the electrons accelerated by the increased electric field are injected into a gate insulating film: this is well known as a channel hot electron phenomenon. Further, a portion of the electrons generated by the impact ionization are injected to the gate insulating film and changes the characteristic of the MIS transistor; this is well known as an avalanche hot electron phenomenon.

In order to solve the problem of the hot electron phenomena, a double diffused drain (DDD) structure and a lightly doped drain (LDD) structure have been proposed since an electric field is not concentrated in the DDD structure, and thus the hot electron phenomenon is reduced. However, in the DDD structure, the effective channel length is decreased and thus a punch through phenomenon is generated. Further, problems of deterioration of the mutual conductance ($g_m$) or breakdown voltage arise.

On the other hand, although the LDD structure has an effect on the channel hot electron phenomenon, it has little effect on the avalanche hot electron phenomenon, in which electrons generated at a deeper portion of the substrate due to the high electric field strength are accelerated so that the electrons are moved to the gate electrode through the gate insulating film. In addition, in the LDD structure, deterioration of the mutual conductance also occurs.

SUMMARY OF THE INVENTION

Accordingly, an object of the present invention is to provide a semiconductor device, particularly MIS FET, wherein the occurrence of the channel hot electron phenomenon and the avalanche hot electron phenomenon are decreased.

Another object of the present invention is to provide a semiconductor device, wherein the mutual conductance ($g_m$) thereof is improved.

According to the present invention there is provided a semiconductor device formed in a semiconductor substrate and having a gate electrode formed on said semiconductor substrate, and source and drain regions formed in said semiconductor substrate wherein the source and drain regions comprise: a first impurity region doped with impurities of an opposite conductivity type to that of the semiconductor substrate formed at portions adjacent to the edge of the gate electrode; a second impurity region doped with impurities an opposite conductivity type to the semiconductor substrate formed at portions under the first impurity region, the impurities of the second impurity region having larger diffusion coefficient than that of the impurities of the first impurity region; a third impurity region doped with impurities of an opposite conductivity type to the semiconductor substrate formed at portions spaced apart from the edge of the gate electrode, the third impurity region having a higher concentration than that of first and second impurity regions and the impurities of the third impurity region having a diffusion coefficient smaller than that of the second impurity region.

BRIEF DESCRIPTION OF THE DRAWINGS

Other objects, features and advantages of the invention will be understood from the following detailed description, taken in conjunction with the accompanying drawings, in which.

DESCRIPTION OF THE PREFERRED EMBODIMENT

Before describing the preferred embodiment of the present invention, the related art will be explained in more detail with reference to the drawings.

Figure 1A:
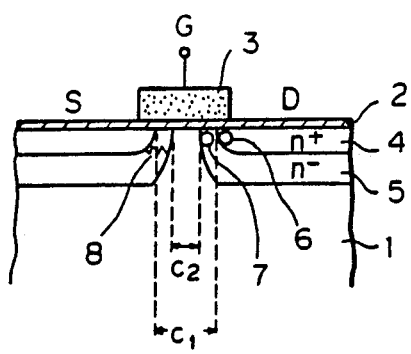
FIG. 1A is a cross-sectional view of a conventional DDD structure.

FIG. 1A is a cross-sectional view of a conventional DDD structure.

In FIG. 1A, an insulating film 2 and a gate electrode 3 are provided on a p-type semiconductor substrate 1. In the substrate 1 an n+ region 4 and an n− region 5 are formed by doping, for example, an arsenic ion (As+) and a phosphorus ion (P+), followed by annealing. Since the diffusion coefficient of phosphorus is remarkably larger than that of arsenic, a double diffused drain (DDD) region, i.e., n+ region (As+) and n− region (P+), is formed. The structure formed before the DDD structure is formed has only the n+ region 4, wherein As+ is diffused, so that a step-junction is formed. Thus, in the prior structure, an electric field was concentrated at a portion 6 in the n+ region 4 where the step-junction is formed, and this led to the problem of the occurrence of the above-mentioned hot electron phenomenon.

Therefore, by forming the above mentioned n− region (P+) 5 of the DDD structure in such a manner that the n− region (P+) 5 is underneath the n+ region 4, a graded junction formed by the diffusion of a P+ electric field is shifted to a portion 7 in the n− region. Consequently, the concentration of an electric field in the portion 7 is considerably decreased compared to that in the portion 6.

However, the DDD structure has an effective channel length (C2) shorter than that (C1) of one prior structure not having an n− region, as shown in FIG. 1A.

Consequently in the DDD structure, a punch through phenomenon often occurs between the source and drain region. Further, in the DDD structure, the properties of an FET are determined by the concentration of P+ in the n− type region 5. When the concentration of P+ is low, a parasitic series resistance is generated, as shown by a reference number 8 in FIG. 1A. Further, the mutual conductance ($g_m$) of the device cannot be increased. On the other hand, when the concentration of P+ is high, the breakdown voltage is lowered.

Figure 1B:
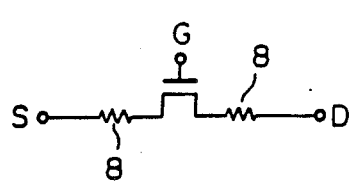
FIG. 1B is an equivalent circuit view of FIG. 1A.

An equivalent circuit of the device shown in FIG. 1A is shown in FIG. 1B.

Figure 2:
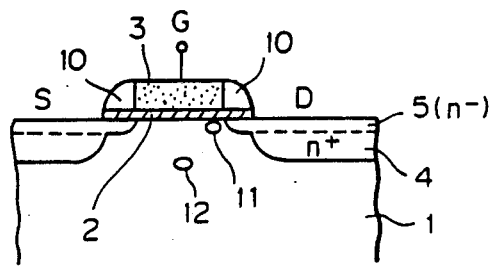
FIG. 2 is a cross-sectional view of a conventional LDD structure.

Referring to FIG. 2, a lightly doped drain (LDD) structure is shown in which a gate insulating film 2, a gate electrode 3, and a side wall 10 are formed on a p-type semiconductor substrate 1. In the substrate 1 an n− region 5 and an n+ region 4 is formed by doping As+ and then performing an annealing process. In the formation process of the n− and n+ regions, As+ having a low concentration is doped into the substrate 1 to form the n− region 5, and As+ having a high concentration is doped therein to form an n+ region 4. Since the diffusion depth ($x_j$) of the doped impurities is determined by the root of the concentration (C) thereof, i.e., $\sqrt{C} \propto x_j$, an LDD structure as shown in FIG. 2 is obtained. The LDD structure can prevent occurrence of channel hot electrons at a portion 11 in FIG. 2. However, the LDD structure cannot prevent the occurrence of avalanche hot electrons which are generated at a deeper portion 12 of the substrate 1, due to the high electric field strength, and accelerated to move into the gate electrode 3 through the gate insulating film 2. Further, the deterioration of the mutual conductance ($g_m$) occurs as in the DDD structure.

Figure 3:
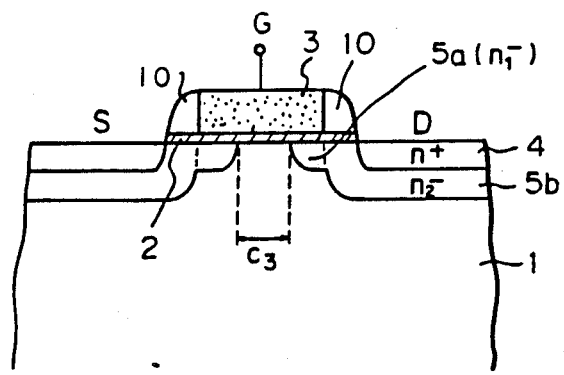
FIG. 3 is a cross-sectional view of another conventional example.

FIG. 3 shows a semiconductor device as disclosed in Japanese Unexamined Patent Publication (Kokai) No. 60-136376. This device (Hitachi structure) has an n+ region 4, an $n_1^-$ region 5a and an $n_2^-$ region 5b in the source and drain regions. Each region is produced by a process wherein P+ is doped to a dosage of $1\times10^{12}$ cm$^{-2}$ using a polycrystalline layer of a gate electrode 3 formed on a gate insulating film 2 as a mask, side walls of SiO$_2$ are formed so that the gate electrode 3 is sandwiched, therebetween, P+ is doped to a dosage of $1\times10^{14}$ cm$^{-2}$ using the gae electrode 3 and the side walls 10 as a mask, P+ doped portions are annealed while the doped P+ is diffused so that the $n_1^-$ region 5a (P+ doped to a dosage of $1\times10^{12}$ cm$^{-2}$) and $n_2^-$ region 5b (P+ doped to a dosage of $1\times10^{14}$ cm$^{-2}$) are formed, As+ is doped to a dosage of $5\times10^{15}$ cm$^{-2}$ using the gate electrode 3 and the side walls 10 as a mask, and the n+ region 4 is formed by annealing the As+ doped portion.

Since the $n_1^-$ region 5a is formed by doping P+, which has a large diffusion coefficient, into the substrate 1, the distance C3 between the edges of the $n_1^-$ regions 5a, i.e., channel length, becomes short and the above-mentioned punch through phenomenon occurs. Further, as explained for the DDD structure, the Hitachi structure is subjected to a resistance due to the diffused $n_1^-$ region 5a, so that the mutual conductance ($g_m$) is lowered. These disadvantages in the Hitachi structure become greater as the semiconductor device become smaller.

Figure 4:
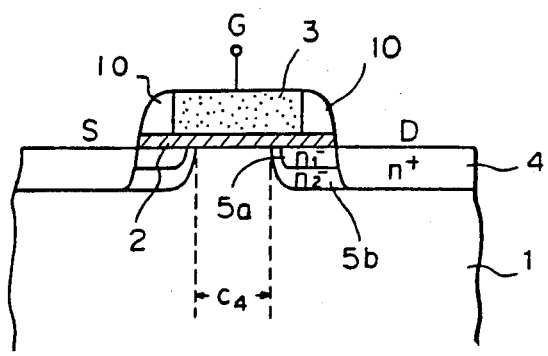
FIG. 4 is a cross-sectional view of still another conventional example.

FIG. 4 shows a semiconductor device disclosed at a Symposium on VLSI Technology, 14 to 16 May, 1985. This device (Toshiba structure) also has three regions, i.e., $n_1^-$, $n_2^-$, and n+ regions.

Each region is produced by a process wherein P+ and As+ are doped using a gate electrode 3 as a mask, the P+ and As+ doped portions are annealed to form the $n_2^-$ region 5b and $n_1^-$ region 5a, respectively, side walls 10 are formed, As+ is doped using the gate electrode 3 and the side walls 10 as a mask, and the second As+ doped portion is annealed to form the n+ region 4. Since the $n_2^-$ region is formed by annealing the P+ doped portion, as explained for the Hitachi structure, the Toshiba structure also has the disadvantage of the occurrence of a punch through phenomenon and the mutual conductance ($g_m$) becomes small.

Preferred embodiments of the present invention will now be explained.

Figure 5A:
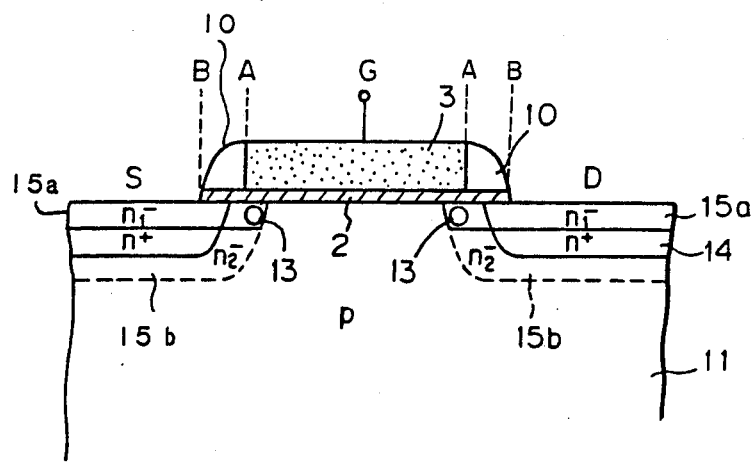
FIG. 5A is a cross-sectional view of an example of an n channel MIS FET according to the present invention.

FIG. 5A shows a cross-sectional view explaining an example of an n channel MIS FET according to the present invention.

As shown in FIG. 5A, a source (S) and a drain (D) region in a P-type semiconductor substrate or p-type well 11 each consist of an $n_1^-$ region 15a, an $n_2^-$ region 15b, and an n+ region 14. An insulating film 2 of, for example, SiO$_2$, a gate electrode 3 of polycrystalline silicon, and side walls 10 of an insulating material are provided on the semiconductor substrate 11. The $n_1^-$ region 15a is formed by doping impurities having a low concentration on outside edge A of the gate electrode 3.

On the other hand, the $n_2^-$ region 15b and the n+ region 14 are formed by doping impurities having a low and a high concentration, respectively, an outside the edge B of the side walls 10. The distance between the N+ region 14 and the gate electrode 3 is preferably equal to the width of one of the sidewalls 10. The diffusion coefficient of impurities doped in the $n_2^-$ region is larger than that of impurities doped in the $n_1^-$ and n+ regions. Although the electric field is concentrated in portion 13 duplicated by the $n_1^-$ region 15a and the $n_2^-$ region 15b, the electric field concentration is reduced due to the graded junction of the $n_2^-$ region. This gives an improvement of the deterioration of properties by two orders, compared to a previous example wherein the hot electron phenomenon could not be avoided. Further, since the $n_2^-$ region has a graded junction, a depletion layer is expanded and thus the stray capacitance of the source and drain regions is decreased and the switching speed of the device can be increased.

Figure 5B:
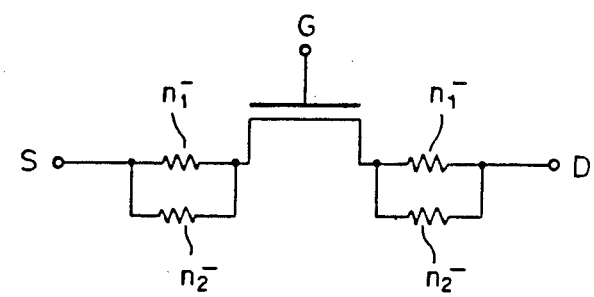
FIG. 5B is an equivalent circuit view of FIG. 5A.

Resistance in the structure is shown in FIG. 5B. Namely, the resistance in, for example, a source region, which is generated by the $n_1^-$ and $n_2^-$ regions is equivalent to total resistance of $n_1^-$ and $n_2^-$ regions connected in parallel to each other (not in series) and is reduced, thus allowing an increase in the mutual conductance ($g_m$).

The process for producing an embodiment according to the present invention will now be described with reference to FIGS. 6A to 6D and FIGS. 7A to 7D respectively.

Figure 6A:
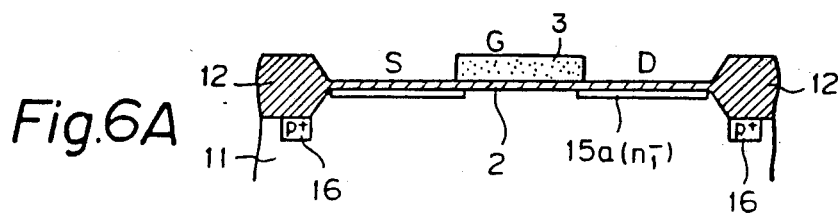
FIGS. 6A to 6D and FIGS. 7A to 7D are cross-sectional views explaining two production processes according to the present invention.

As shown in FIG. 6A, p type channel cut regions 16, a field insulating film 12 of, for example, SiO$_2$, and a gate insulating film 2 of, for example, SiO$_2$, are formed on a p type semiconductor substrate 11 which has an impurity concentration of $10^{15}-10^{16}$ cm$^{-3}$, and then a gate electrode 3 having a thickness of 2000 to 5000 Å is formed. The gate electrode 3 is made of polycrystalline silicon, a high melting point metal or high melting point metalsilicide, etc. Then, As+ is doped to a dosage of $1\times10^{13}$ to $1\times10^{15}$ cm$^{-2}$ at an accelerating energy of 60 to 120 KeV so that the first lightly doped n⁻ regions, i.e., $n_1^-$ regions, 15a are formed.

Figure 6B:
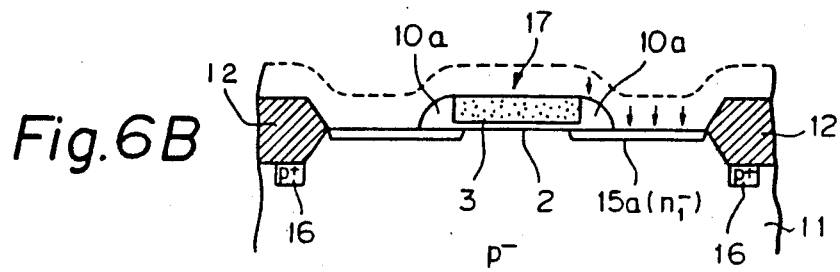

Then, as shown in FIG. 6B, an insulating layer 17 having a thickness of 500 to 5000 Å is formed on the obtained structure. The insulating layer is made of $SiO_2$ or $Si_3N_4$ obtained by a chemical vapour deposition (CVD) process, etc.

Next, the insulating layer 17 of, for example, CVD-$SiO_2$, is entirely removed by a reactive ion etching (RIE) process using $CHF_3$ gas or a mixed gas of $CHF_3$ and $CF_4$ under a pressure of 0.1 to 0.2 torr so that side walls 10a are formed in such a manner that they sandwich the gate electrode 3.

Figure 6C:
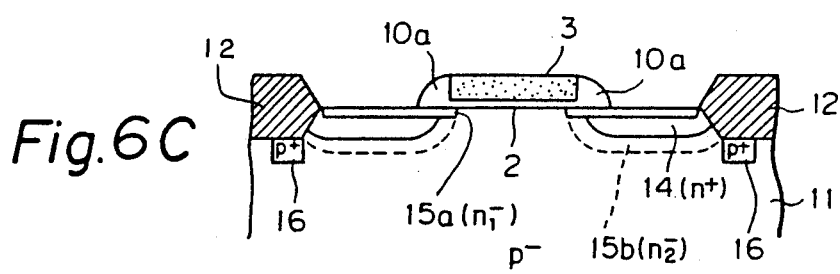

Then, as shown in FIG. 6C P+ having a larger diffusion coefficient than As+ is doped to a dosage of $1 \times 10^{13}$ to $1 \times 10^{15}$ cm$^{-2}$ at an accelerating energy of 60 to 80 KeV to form a second lightly doped n⁻ region, i.e., $n_2^-$ region 15b, and As+ is doped to a dosage of $3 \times 10^{15}$ to $5 \times 10^{15}$ cm$^{-2}$ at an accelerating energy of 60 to 120 KeV to form a heavily doped or high concentration n+ region 14. The obtained structure is then annealed at a temperature of 900° C. to 1100° C. in an inert gas atmosphere.

The $n_2^-$ region has a graded junction formed between the $n_2^-$ region and the substrate 11. The graded junction surface formed between the $n_2^-$ region 15b and the substrate 11 forms a surface substantially tangential with a junction surface formed between the $n_1^-$ region 15a and the substrate 11.

Figure 6D:
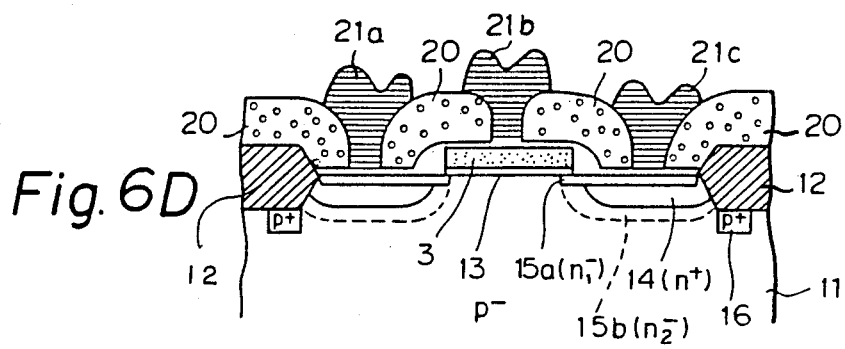

Then, as shown in FIG. 6D, an insulating layer 20 of, for example, phospho-silicate glass (PSG), boron silicate glass (BSG), etc., is formed, and an aluminum source drawing electrode 21a, an aluminum gate drawing electrode 21b, and an aluminum drain drawing electrode 21C are formed by a usual process thus producing a first embodiment of the present invention.

A process for producing a second embodiment of the present invention will now be described.

Figure 7A:
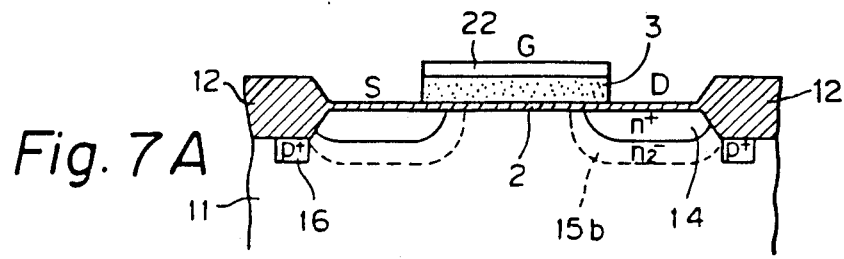

As shown in FIG. 7A, P type channel cut regions 16, a field insulating film 12, and a gate insulating film 2 are formed on a p type semiconductor substrate 11. Then a gate electrode 3 having a thickness of 2000 to 5000 Å and a width longer than the width of the first embodiment explained above is formed using a mask 22 of CVD $SiO_2$ having a thickness of 500 to 2000 Å. The material of the gate electrode is the same as that used in the first embodiment. Then, P+ is doped to a dosage of $1 \times 10^{13}$ to $1 \times 10^{15}$ cm$^{-2}$ at an accelerating energy of 60 to 80 KeV to form a lightly doped $n_2^-$ region 15b. Then As+ is doped to a dosage of $3 \times 10^{15}$ to $5 \times 10^{15}$ cm$^{-2}$ at an accelerating energy of 60 to 120 KeV to form a heavily doped or high concentration n+ region 14.

Figure 7B:
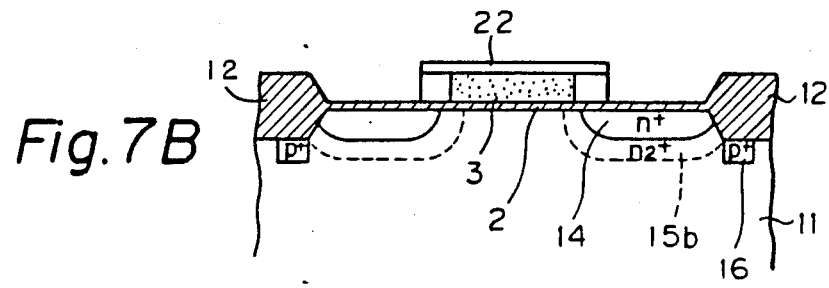

Then as shown in FIG. 7B both sides of the gate electrode 3 are removed by a side plasma etching process using a mixed gas of $CF_4$ and $O_2$ (5%) in a polycrystalline silicon gate electrode so that a width of 1000 to 4000 Å is removed from each side thereof.

Figure 7C:
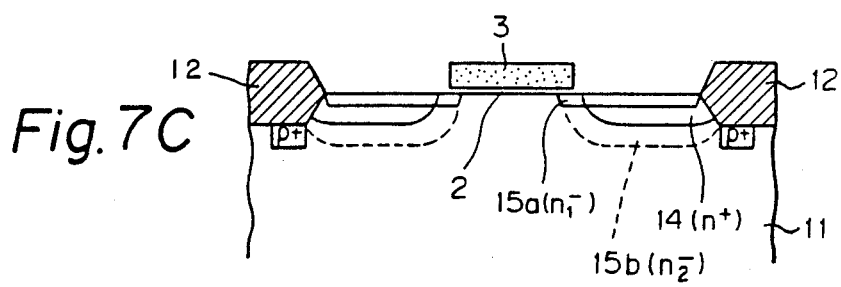

Then, as shown in FIG. 7C, the mask 22 of CVD $SiO_2$ is removed and As+ is doped to a dosage of $1 \times 10^{13}$ to $1 \times 10^{15}$ cm$^{-2}$ at an accelerating energy of 60 to 120 KeV to form lightly doped $n_1^-$ region 15a. Then, an annealing process is carried out at a temperature of 900° C. to 1100° C. in an inert gas atmosphere.

Figure 7D:
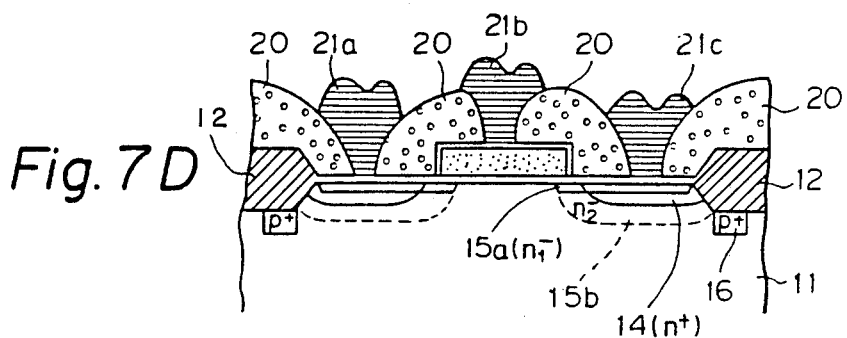

Finally, as shown in FIG. 7D, an insulating layer 20 and aluminum electrodes 21a, 21b, and 21c are formed as described in the first embodiment, thus, producing a second embodiment of the present invention.

We claim:

1. A semiconductor device including a semiconductor substrate with a first conductivity type and source and drain regions and a gate electrode having an edge, said source and drain regions comprising:
   a first impurity region having a second conductivity type opposite said first conductivity type and having a first impurity concentration, said first impurity region formed adjacent to a surface of said substrate, and having an end approximately adjacent to the edge of said gate electrode;
   a second impurity region having the second conductivity type, said second impurity region being located beneath said first impurity region and having an end that is approximately coincident with said end of said first impurity region, said second type of impurity having a diffusion coefficient larger than that of said first type of impurity;
   a third impurity region located adjacent said first and second impurity regions and having the second conductivity type and being spaced from the edge of said gate electrode, said third impurity region having a third impurity concentration that is higher than said first and second impurity concentrations.

2. A semiconductor device according to claim 1, wherein said first impurity region includes arsenic ions.

3. A semiconductor device according to claim 2, wherein said arsenic ions are doped into said semiconductor substrate to a dosage of $1 \times 10^{13}$ to $1 \times 10^{15}$ cm$^{-2}$ and at an accelerating energy of 60 to 120 KeV.

4. A semiconductor device according to claim 1, wherein said second impurity region includes phosphorus ions.

5. A semiconductor device according to claim 4, wherein said phosphorus ions are doped into said semiconductor substrate to a dosage of $1 \times 10^{13}$ to $1 \times 10^{15}$ cm$^{-2}$ and at an accelerating energy of 60 to 80 KeV.

6. A semiconductor device according to claim 1, wherein said third impurity region includes arsenic ions.

7. A semiconductor device according to claim 6, wherein said arsenic ions are doped into said semiconductor substrate to a dosage of $3 \times 10^{15}$ to $5 \times 10^{15}$ cm$^{-2}$ and at an accelerating energy of 60 to 120 KeV.

8. A semiconductor device according to claim 1, further comprising a side wall having a width and being located adjacent to the gate electrode, and said third impurity region being spaced from the edge of said gate electrode by an amount approximately equal to the width of said side wall.

9. A semiconductor device according to claim 1, wherein said source and drain regions have edges, further comprising:
   a first junction surface between said first impurity region and said semiconductor substrate; and
   a second junction surface substantially tangential to said first junction surface and situated between said second impurity region and said semiconductor substrate and corresponding to the edges of said source and drain regions adjacent to the edge of said gate electrode.

10. A semiconductor device including a semiconductor substrate of a first conductivity type, comprising:
   a gate electrode having first and second opposite edges; and
   first and second conducting regions, each including:
      a first impurity region being doped with a first impurity having a second conductivity type and a first diffusion coefficient, to a first impurity concentration, said first impurity region being formed adjacent to a surface of the semiconductor substrate and having a boundary with the substrate;

a second impurity region being doped with a second impurity having the second conductivity type and a second diffusion coefficient, said second impurity region having an edge that is approximately coincident with said boundary and being positioned beneath said first impurity region, and having a second impurity concentration substantially the same as said first impurity concentration; and a third impurity region having the second conductivity type situated adjacent said first and second impurity regions, said third impurity having a third impurity concentration that is higher than said first and second impurity concentrations.

11. A semiconductor device formed in a semiconductor substrate comprising:

a gate electrode located on said semiconductor substrate; and first and second conducting regions, each including a first impurity region being located in and having a boundary with the substrate and a first conductivity;

a second impurity region positioned beneath said first impurity region and having an edge that is approximately coincident with said boundary, said second impurity region having a diffusion coefficient greater than that of said first impurity region and having said first conductivity; and a third impurity region situated at a predetermined distance from said gate electrode and adjacent said first and second impurity regions, said third impurity region having a diffusion coefficient smaller than that of said second impurity region.

12. A semiconductor device according to claim 11, wherein said semiconductor substrate is of a first conductivity type and wherein said first impurity region comprises a plurality of impurities of a second conductivity type.

13. A semiconductor device according to claim 12, wherein said second impurity region comprises a plurality of impurities of the second conductivity type and having a diffusion coefficient greater than that of the impurities of said first impurity region.

14. A semiconductor device according to claim 13, wherein said third impurity region comprises a plurality of impurities of said second conductivity type and having a higher concentration of impurities than that of said first and second impurity regions, and having a diffusion coefficient smaller than that of said second impurity region.

15. A semiconductor device according to claim 14, wherein said first impurity region includes arsenic ions.

16. A semiconductor device according to claim 14, wherein said second impurity region includes phosphorus ions.

17. A semiconductor device according to claim 14, wherein said third impurity region includes arsenic ions.

* * * * *